(12) United States Patent
Linares et al.

(10) Patent No.: US 10,892,606 B2
(45) Date of Patent: Jan. 12, 2021

(54) VENTILATION UNIT FOR ELECTRICAL ENCLOSURE

(71) Applicant: Schneider Electric Industries SAS, Rueil Malmaison (FR)

(72) Inventors: Louis Linares, La Terrasse (FR); Josep Lopez, Barcelona (ES)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 16/696,116

(22) Filed: Nov. 26, 2019

(65) Prior Publication Data

US 2020/0187382 A1 Jun. 11, 2020

(30) Foreign Application Priority Data

Dec. 7, 2018 (FR) ..................................... 18 72476

(51) Int. Cl.
*H02B 1/56* (2006.01)
*H05K 7/20* (2006.01)
(Continued)

(52) U.S. Cl.
CPC ........... *H02B 1/565* (2013.01); *H05K 5/0213* (2013.01); *H05K 7/20145* (2013.01);
(Continued)

(58) Field of Classification Search
CPC .......... H05K 7/20136–20172; H05K 7/20181; H05K 5/0213; H02B 1/56; H02B 1/565; F04D 29/58–5893
(Continued)

(56) References Cited

U.S. PATENT DOCUMENTS

| 6,699,301 B1* | 3/2004 | Eisenhauer | B01D 46/0034 55/471 |
| 2006/0012947 A1* | 1/2006 | Nakata | H05K 7/20154 361/600 |

(Continued)

FOREIGN PATENT DOCUMENTS

| DE | 3013756 | 10/1981 |
| DE | 9408362 | 9/1994 |

(Continued)

OTHER PUBLICATIONS

English Language Machine Translation of German Patent Publication No. DE3013756 dated Oct. 15, 1981, 7 pages.

(Continued)

*Primary Examiner* — Zachary Pape
(74) *Attorney, Agent, or Firm* — Locke Lord LLP

(57) ABSTRACT

A ventilation unit for an electrical cabinet, comprising a fan, a casing that comprises a plinth and a cover assembled on the plinth, wherein:
the casing has a straight slab form having a square base, four lateral faces and an upper face; and
the plinth comprises a lower wall forming the base of the casing and a lateral wall following the four lateral faces of the casing, an opening made through the lower wall thereof and a seat made around the opening thereof and receiving the fan, and wherein
following each lateral face, the lateral wall of the plinth comprises a first grid and the ventilation unit comprises a second grid mounted pivotably and covering the first grid.

9 Claims, 11 Drawing Sheets

(51) Int. Cl.
*H05K 5/02* (2006.01)
*F04D 25/14* (2006.01)

(52) U.S. Cl.
CPC ..... *H05K 7/20172* (2013.01); *H05K 7/20181* (2013.01); *H05K 7/20572* (2013.01)

(58) Field of Classification Search
USPC ........................................................ 454/184
See application file for complete search history.

(56) References Cited

U.S. PATENT DOCUMENTS

| | | | |
|---|---|---|---|
| 2007/0165379 A1* | 7/2007 | Chang | H05K 7/20181 361/695 |
| 2008/0045135 A1 | 2/2008 | Pfannenberg | |
| 2013/0067875 A1* | 3/2013 | Hartmann | B01D 46/10 55/428 |
| 2013/0314850 A1* | 11/2013 | Takahashi | H02B 1/565 361/678 |
| 2020/0083677 A1* | 3/2020 | Kleinecke | H02B 1/565 |
| 2020/0187382 A1* | 6/2020 | Linares | F04D 29/462 |
| 2020/0187384 A1* | 6/2020 | Linares | H05K 7/20209 |

FOREIGN PATENT DOCUMENTS

| | | | |
|---|---|---|---|
| DE | 202013103846 | 9/2013 | |
| EP | 1878484 | 1/2008 | |
| JP | 10108323 A * | 4/1998 | ............ H02B 1/565 |
| WO | WO2014035661 | 3/2014 | |
| WO | WO2015127989 | 9/2015 | |

OTHER PUBLICATIONS

English Language Machine Translation of German Patent Publication No. DE9408362 dated Sep. 8, 1994, 11 pages.
English Language Machine Translation of German Patent Publication No. DE202013103846 dated Sep. 30, 2013, 14 pages.
Search Report and Written Opinion for French Patent Application No. FR1872476 dated Aug. 7, 2019, 7 pages.

* cited by examiner (A)

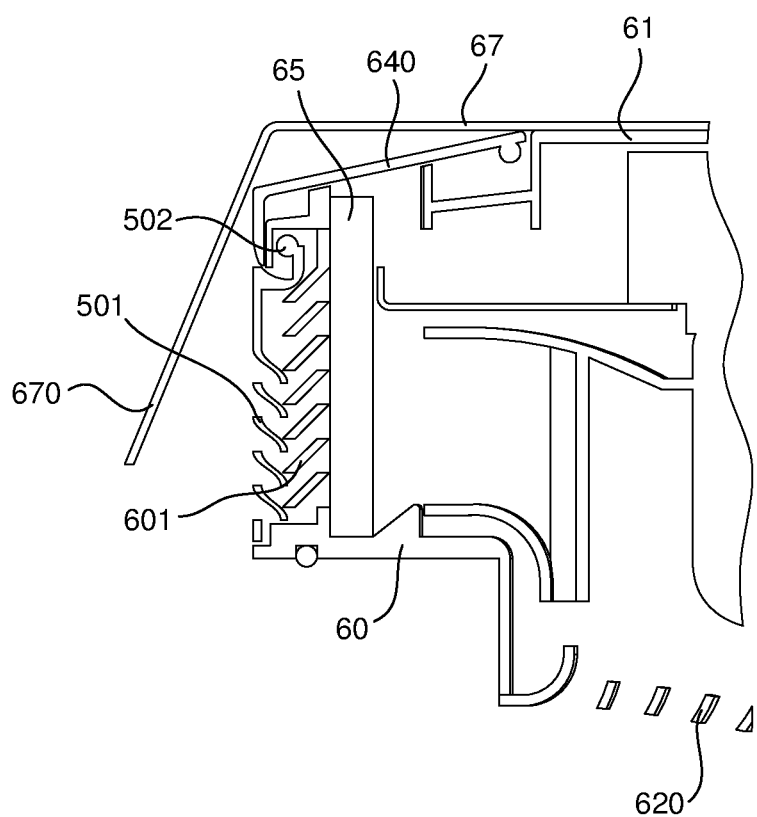

VENTILATION UNIT FOR ELECTRICAL ENCLOSURE

TECHNICAL FIELD OF THE INVENTION

The present invention relates to a ventilation unit for an electrical cabinet, such as an electrical enclosure.

The invention also relates to an electrical installation comprising an electrical cabinet on which there are positioned multiple ventilation units in accordance with the invention.

PRIOR ART

Managing the temperature within an electrical cabinet, such as an electrical enclosure or an electrical panel, is a question that receives frequent attention. The equipment present in the electrical enclosure tends to heat up and so it is necessary to keep the temperature inside the enclosure below a given threshold, lest the equipment suffer. To address this constraint, it is conventional to use a ventilation system to establish a flow of air through the volume of the electrical enclosure by drawing air in from outside and expelling the hot air present in the enclosure to the outside.

Known ventilation systems are frequently placed on the upper wall of the electrical enclosure. They comprise an inlet connected to the internal volume of the enclosure in order to receive an outward flow of air, an air outlet and a fan placed between the inlet and the outlet in order to draw the flow of air from the inlet towards the outlet.

In general, the ventilation system associated with an electrical enclosure consists of a unit positioned on the upper wall of the electrical enclosure. This unit is most often designed to satisfy only a single protection rating (IP code), which limits its use. Moreover, it is very often bulky and takes up all of the upper wall of the enclosure, which makes it impossible to easily adapt the air flow that is to be generated through the electrical enclosure, for example in the event of changes in the electrical equipment housed in the electrical enclosure, and impossible to establish redundancy between multiple ventilation units associated with a single electrical enclosure.

The aim of the invention is to propose a ventilation unit which is designed to be used for an electrical cabinet, and which can in particular have multiple protection ratings without having to be replaced and without complex modifications to its architecture. It will be easy to link the ventilation unit to one or more other similar ventilation units in order to meet the above-defined objectives.

SUMMARY OF THE INVENTION

This aim is met with a ventilation unit for an electrical cabinet, comprising a fan, a casing that comprises a plinth and a cover assembled on the plinth, characterized in that:
- the casing has a straight slab form having a square base, four lateral faces and an upper face,
- said plinth comprises a lower wall forming said base of the casing and a lateral wall following the four lateral faces of the casing, an opening made through the lower wall thereof and a seat made around the opening thereof and receiving the fan,
- the cover is affixed to the plinth and comprises the upper face of the casing,
- following each lateral face, the lateral wall of the plinth comprises a first grid and the ventilation unit comprises a second grid mounted pivotably and covering said first grid.

According to one feature, the ventilation unit comprises multiple cavities, each arranged in front of each first grid of the plinth and in that the ventilation unit comprises a distinct filter element positioned in each cavity, in front of each first grid of the plinth.

According to another feature, the cover comprises multiple pivoting flaps, each providing access to a distinct cavity receiving the filter element.

According to another feature, each second grid is attached to the cover and is mounted pivotably on said cover.

According to another feature, the ventilation unit comprises a protective hood forming a hat intended to cover said casing.

According to another feature, the protective hood comprises a main wall affixed to the cover and multiple inclined lateral flanks extending in front of the lateral faces of said casing.

The invention also relates to an electrical installation comprising an electrical cabinet having a lower wall, an upper wall and lateral walls, said installation comprising a modular ventilation system comprising multiple independent, identical ventilation units, each ventilation unit being as defined hereinabove and positioned on the upper wall of the electrical cabinet.

According to one feature, the ventilation units are positioned on the upper wall of the electrical enclosure, touching at at least one of their lateral faces.

According to another feature, the installation comprises an adaptable air flow management system on the electrical cabinet, said air flow management system comprising:
- a casing comprising at least one air inlet intended to be brought into communication with the internal volume of the electrical cabinet, at least two air outlets and at least one main duct arranged to connect said air inlet to the two air outlets,
- a switching device arranged inside said main duct, between the first air outlet and the second air outlet, said switching device comprising mobile shutters that can be switched between a first position in which the air inlet communicates solely with the first air outlet and a second position in which the air inlet communicates at least with the second air outlet.

BRIEF DESCRIPTION OF THE FIGURES

Other features and advantages will appear in the following detailed description given with regard to the appended drawings, in which:

FIGS. 6A to 6E show, by means of views in section, various configurations adopted by the ventilation unit of the invention.

DETAILED DESCRIPTION OF AT LEAST ONE EMBODIMENT

Figure 1:
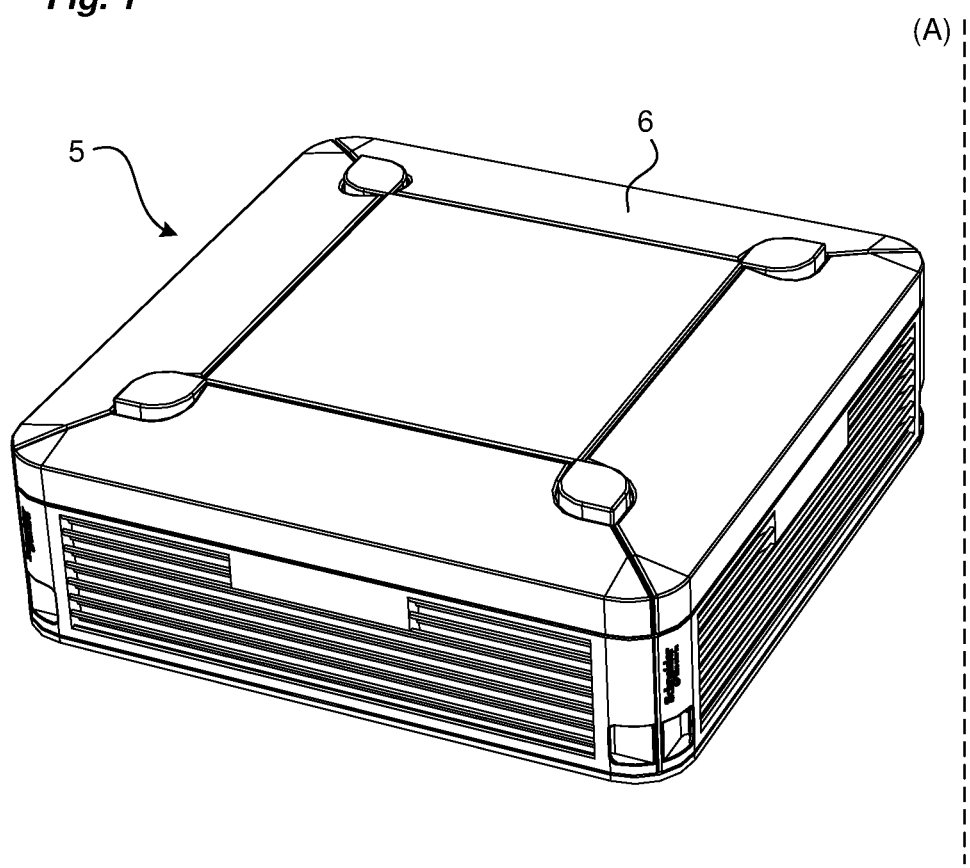
FIG. 1 shows a ventilation unit in accordance with the invention.

The invention relates to a ventilation system which is adaptable on an electrical cabinet. An electrical cabinet is to be understood as an electrical enclosure, an electrical panel or the like. In the remainder of the description and in the drawings, the electrical cabinet will be understood to be an electrical enclosure 1.

In the remainder of the description, the terms "upper", "lower" or the like are to be considered in relation to a vertical axis (A), shown in the appended figures.

Figure 12A:
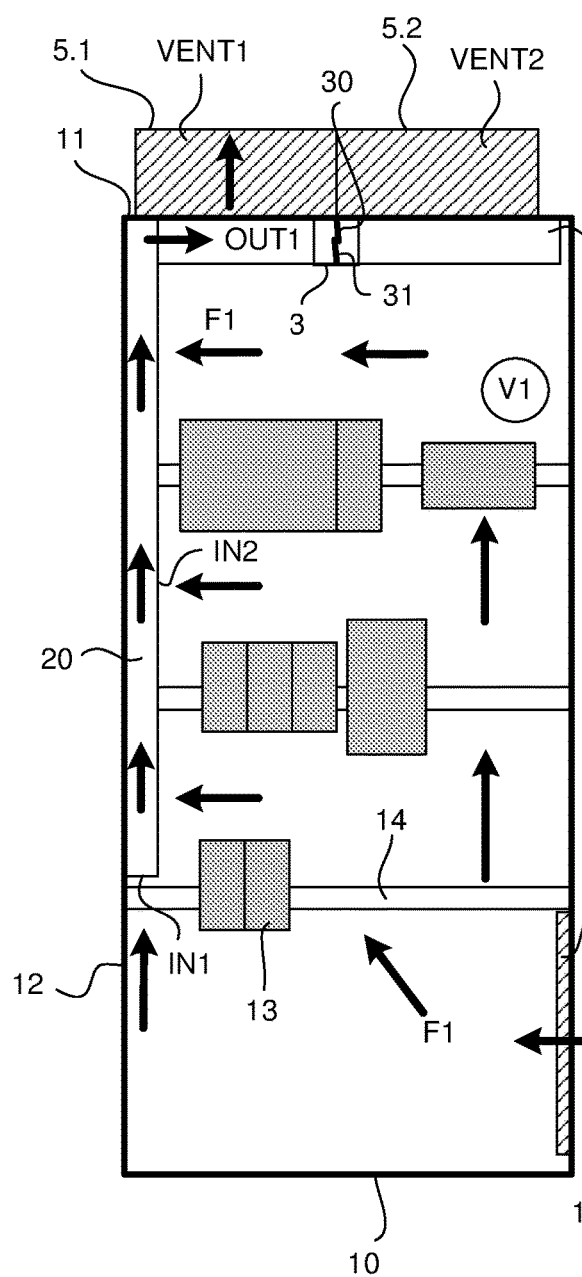
FIGS. 12A and 12B illustrate the operating principle of the air flow management system in accordance with the invention.
Figure 12B:
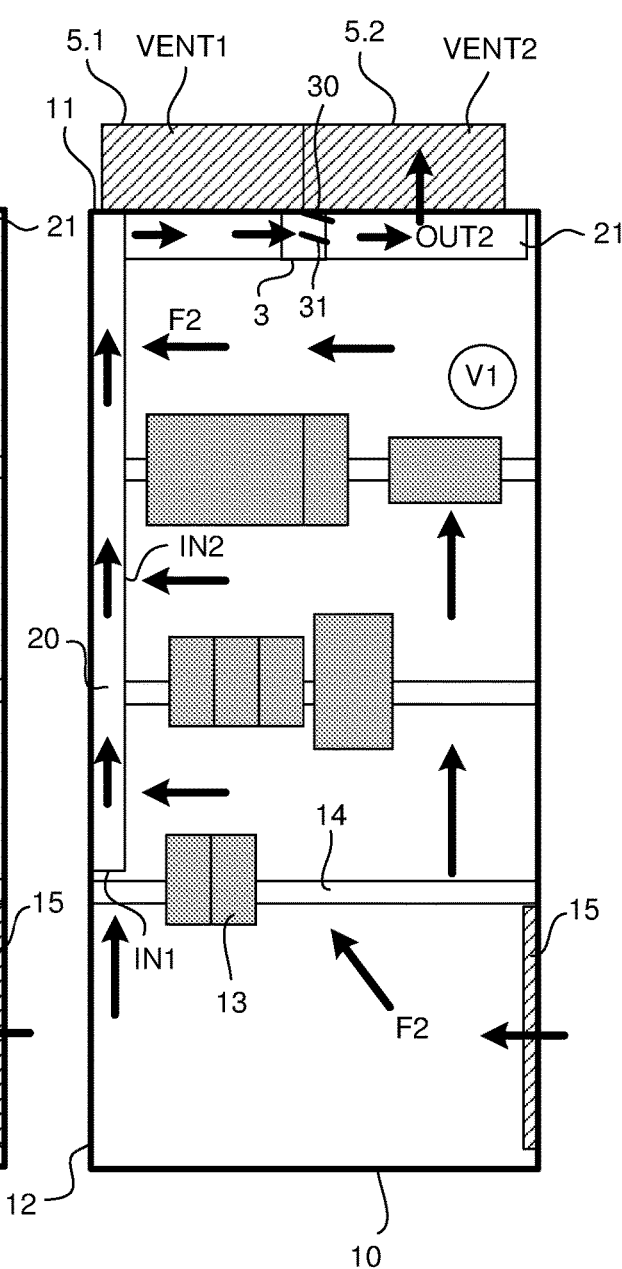

In a non-limiting manner, an electrical enclosure 1 may comprise a lower wall 10, an upper wall 11 and four lateral walls 12 in mutually opposite pairs. These walls bound a first internal volume V1 in which electrical equipment is placed. In the electrical enclosure, the electrical equipment 13 may be mounted on supports, such as suitable uprights and rails 14. The electrical enclosure 1 comprises a grid 15 which permits an exchange of air between the internal volume and the exterior. FIGS. 12A and 12B show, clearly, the features of an electrical enclosure of this kind.

The electrical enclosure 1 may be made of a metal material.

The ventilation system comprises one or more ventilation units 5 (also referenced 5.1, 5.2, 5.3, 5.4 in the appended figures when multiple units are present), wherein each ventilation unit 5 is placed on the upper wall 11 of the electrical enclosure 1 and comprises an air inlet in communication with the internal volume V1 of the electrical enclosure. Conventionally, in operation, each ventilation unit 5 establishes a flow of air through the volume of the enclosure 1, bringing outside air in through the grid 15 and expelling the hot air to the outside. The grid 15 is advantageously positioned in the lower portion of the electrical enclosure, opposite each ventilation unit, so that the flow of air can flow through the entire internal volume V1 of the electrical enclosure (see FIGS. 12A and 12B).

Figure 2:
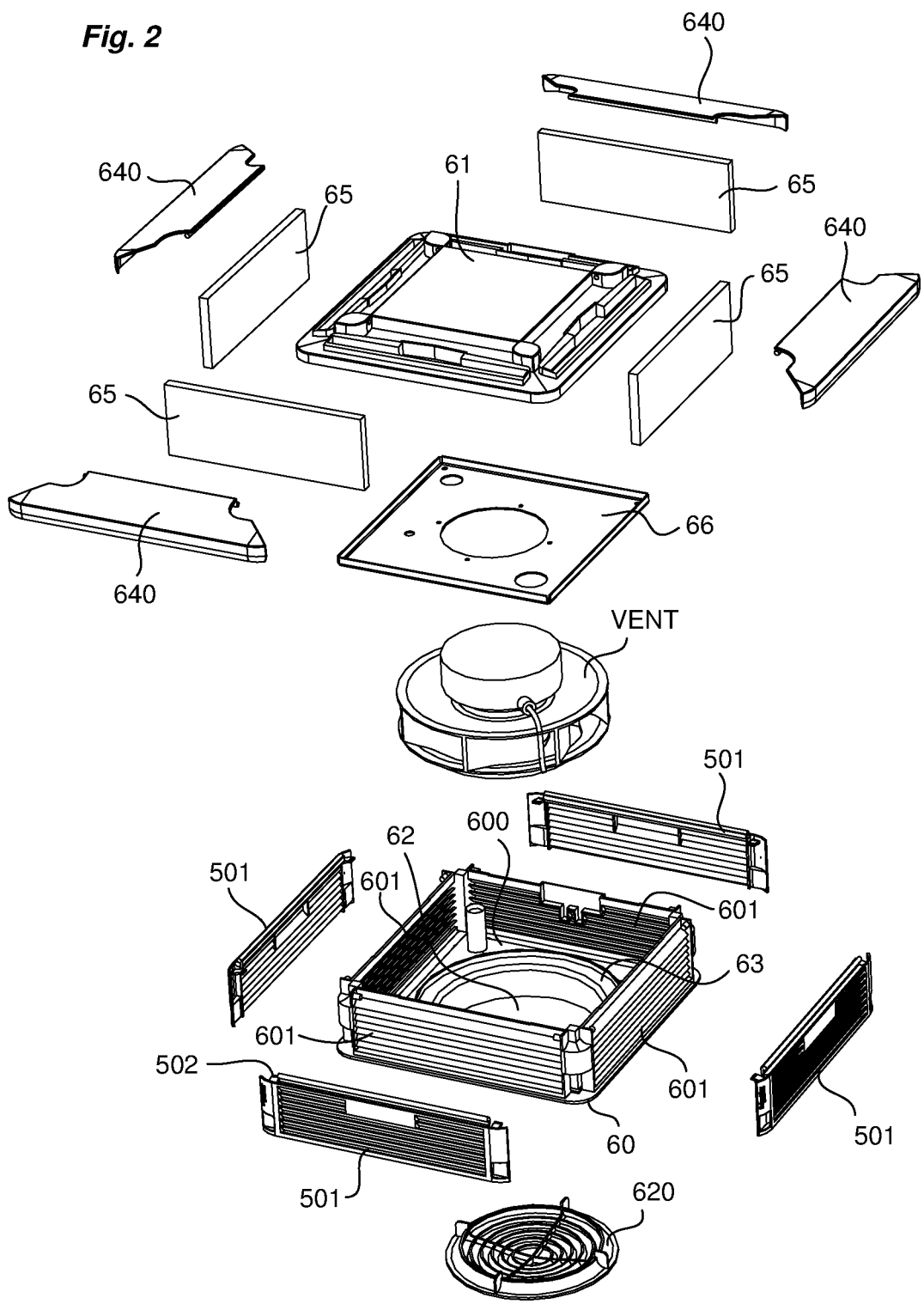
FIG. 2 shows the ventilation unit in accordance with the invention, in an exploded view.
Figure 3:
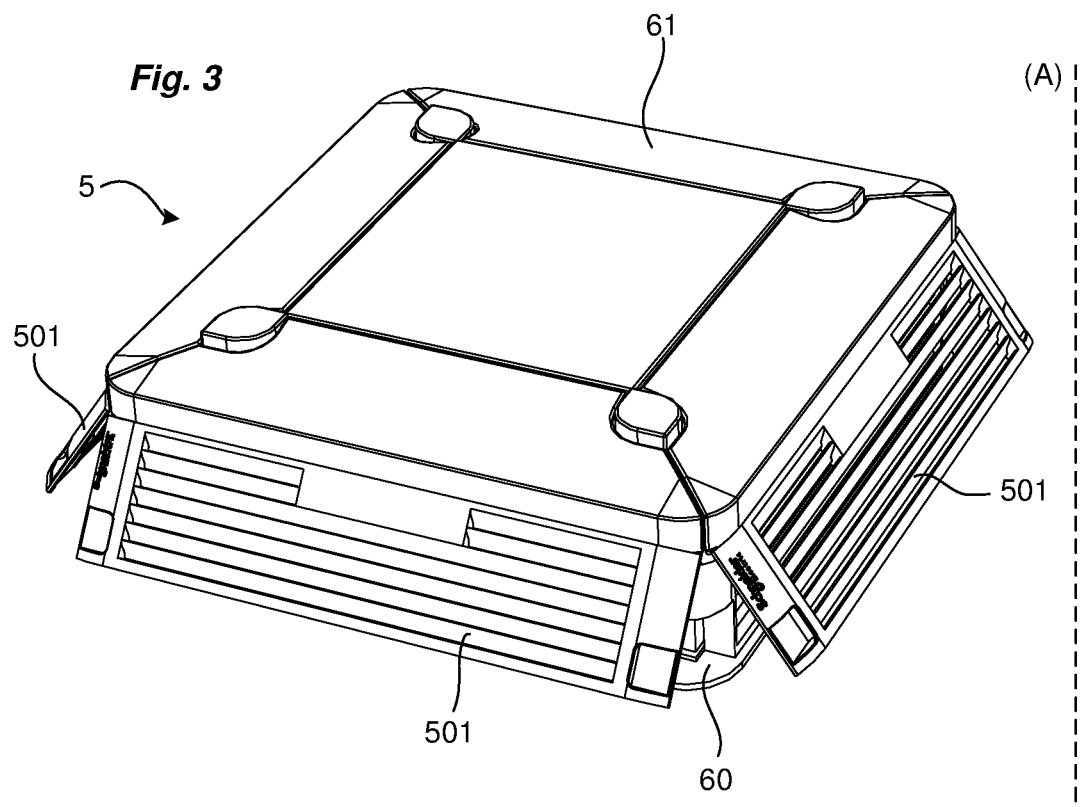
FIGS. 3, 4 and 5 show various configurations of the ventilation unit in accordance with the invention.
Figure 4:
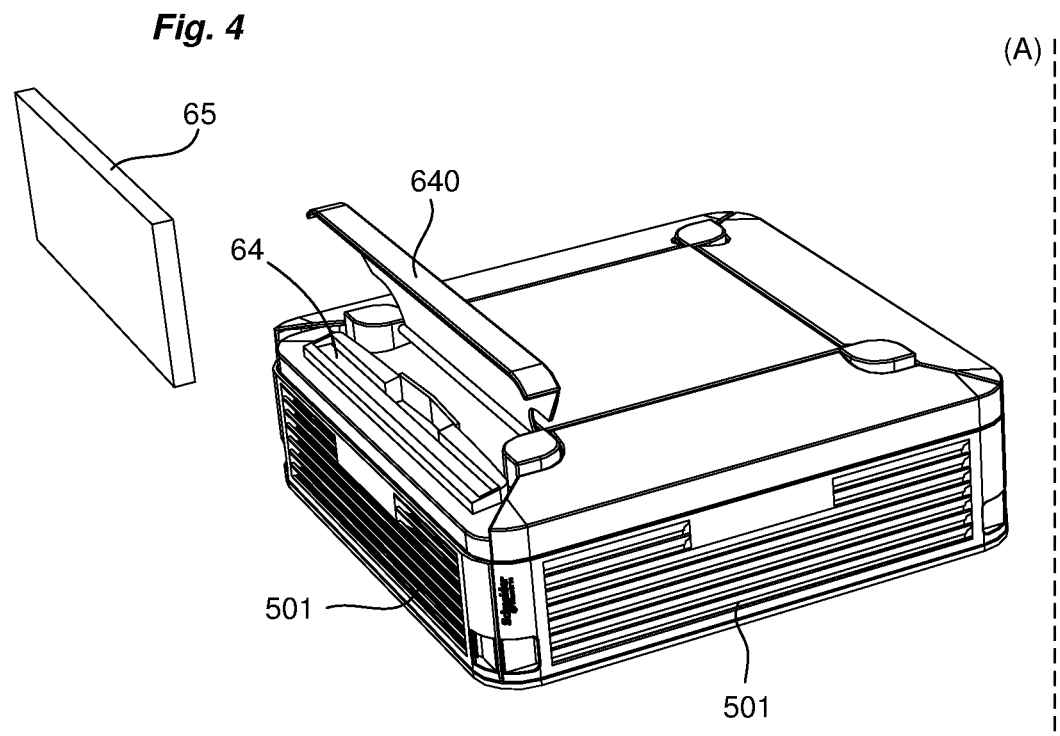

With reference to FIGS. 1 and 2, a ventilation unit 5 in accordance with the invention comprises a casing 6 comprising, principally, a plinth 60 and a cover 61 fitted onto said plinth and a fan (VENT) that is accommodated in said casing 6.

The ventilation unit 5 has a straight slab form having a square base which, as will be seen hereinafter, allows it to easily fit together with other identical ventilation units in a small space. Thus, the ventilation unit 5 has an upper face, a lower face and four lateral faces that are parallel in pairs.

Its plinth 60 comprises a lower wall 600 whose outer face forms the lower face of the unit 5 and multiple lateral flanks that follow the four lateral faces of the ventilation unit 5.

The lower wall of the plinth 60 comprises an opening 62, for example circular in shape, and around this opening there is a seat 63 where the fan VENT of the ventilation unit 5 is to be fitted. Means for securing the fan can be provided on said seat 63 for the purpose of securing the fan in its cavity. The fan VENT is positioned on the seat 63 so that its air intake coincides with the opening 62. A circular grid 620 can be placed in front of its opening 62.

The lateral wall of the plinth 60 is created in the form of four grids, referred to as internal grids 601, which follow the four faces of the ventilation unit 5.

The cover 61 is designed to fit onto the plinth 60 so as to close it off at the top. It takes the form of a plate whose outer face forms the upper face of the ventilation unit.

The unit 5 also comprises four mobile grids, referred to as external grids 501, which are each designed to be placed in front of an internal grid 601 of the plinth such that they can be positioned following a distinct lateral face of the unit. Each one of these mobile external grids 501 is mounted so as to be able to pivot about an axis that follows the upper edge of the lateral face of the unit 5. Each mobile external grid 501 may be attached to the cover and may comprise two opposite attachment tabs 502, each mounted pivotably in an orifice of the cover 61. Thus, each mobile external grid 501 may adopt a "closed" position in which it is folded down against the corresponding internal grid 601 of the plinth, and one or more other open positions in each of which it can be pivoted about its axis so as to have a given non-zero angle of inclination.

The internal grids 601 and the external grids 501 each have slats. The slats of each internal grid 601 are inclined at an acute angle with respect to a vertical plane and the slats of each corresponding external grid 501 are inclined symmetrically with respect to said vertical plane (so as to form chevrons) (see FIG. 6B).

Along each of its external edges, the cover 61 can also comprise a distinct slot 64 which opens into an internal cavity of the casing 6. This cavity is located just in front of the corresponding internal grid 601 of the plinth and is arranged so as to accommodate a filter element 65. For each slot 64, the cover may comprise a pivoting flap 640 that is designed to cover the slot when in the closed position and to allow access to the slot 64 and to the cavity when in the open position after pivoting.

The filter element 65 can be any type of foam or the like which can retain particles while allowing a flow of air to pass through.

The ventilation unit 5 may also comprise a plate 66 arranged between the head of the fan and the cover, designed to hold the fan in the ventilation unit.

Figure 5:
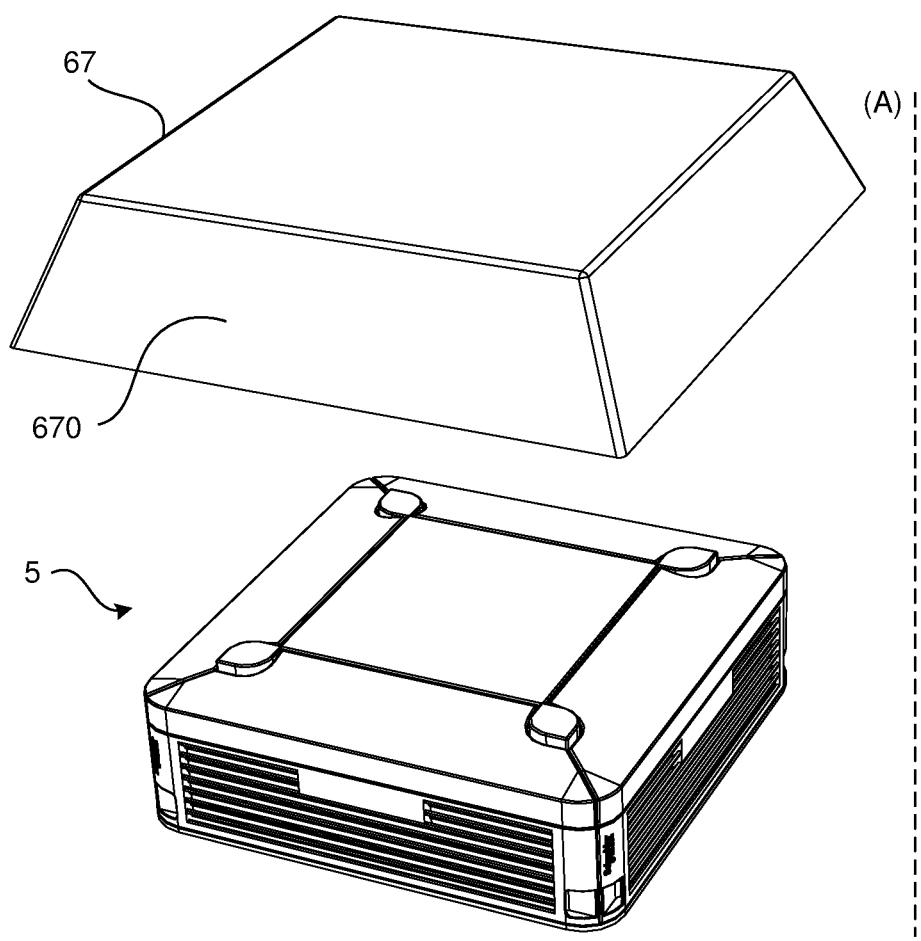

Moreover, the ventilation unit 5 may also comprise a protective hood 67 (FIG. 5), added to increase its protection rating (IP code). This protective hood 67 is in the form of a hat and comprises a square-shaped upper plate that is intended to come to rest on the cover and multiple flanks 670 that are inclined downwards and outwards, each designed to be positioned in front of a distinct lateral face of the unit in order to protect it.

According to one feature, the ventilation unit 5 according to the invention thus has an architecture which allows it to have various protection ratings, simply by changing its configuration. Thus, FIGS. 6A to 6E illustrate the various configurations of the ventilation unit, for each protection rating.

Figure 6A:
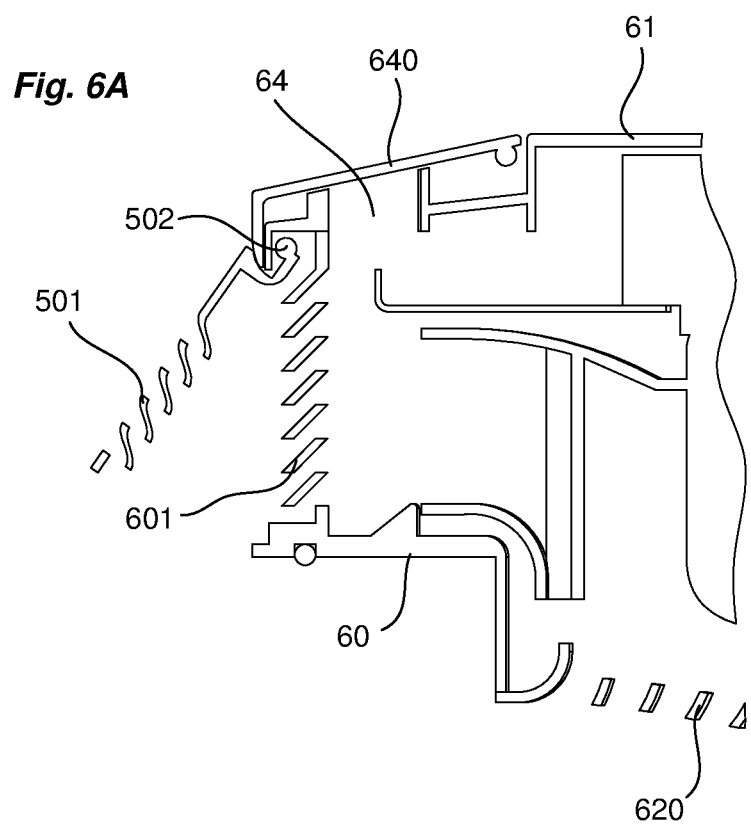

FIG. 6A—IP41: To be in this first configuration, the unit does not include the filter elements and each external grid 501 is pivoted through a given non-zero angle, advantageously less than 90°.

Figure 6B:
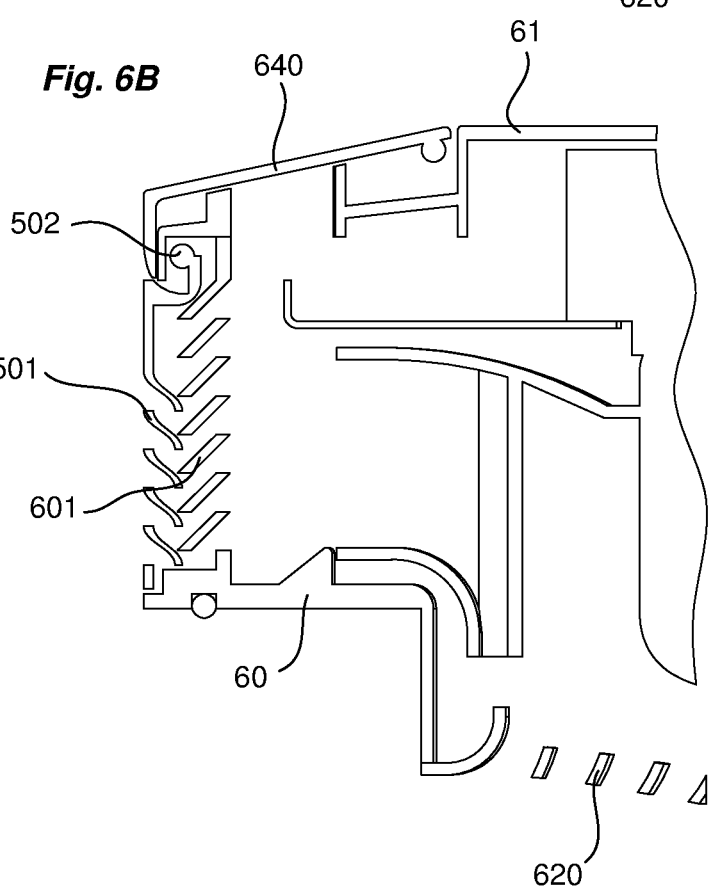

FIG. 6B—IP44: This second configuration is identical to the first configuration, with the exception that the external grids 501 are all folded down and are therefore positioned in front of each internal grid 601.

Figure 6C:
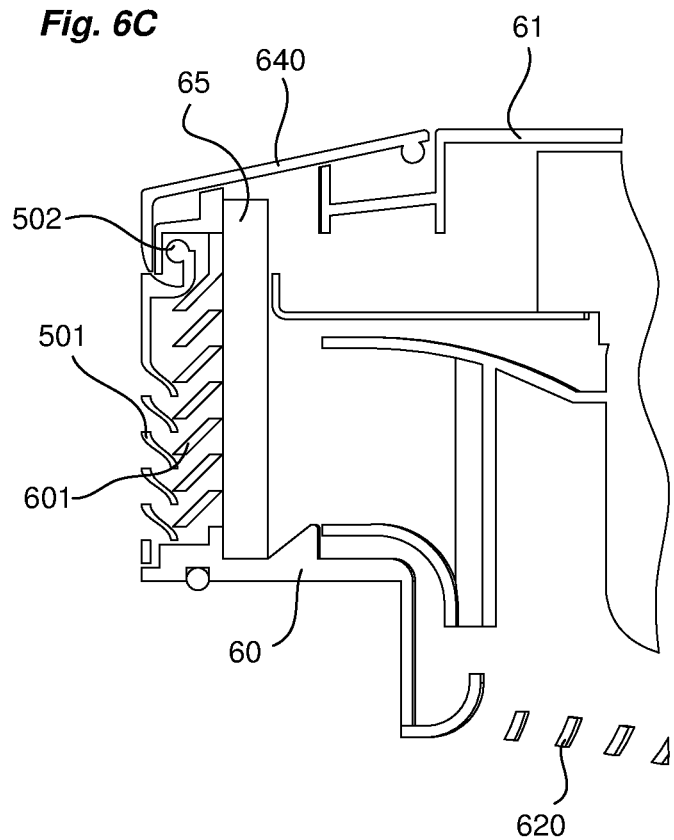

FIG. 6C—IP54: This third configuration repeats the features of the first configuration, adding a filter element 65 in front of each internal grid 601. In this configuration, the external grids 501 are thus each pivoted through a given non-zero angle.

Figure 6D:
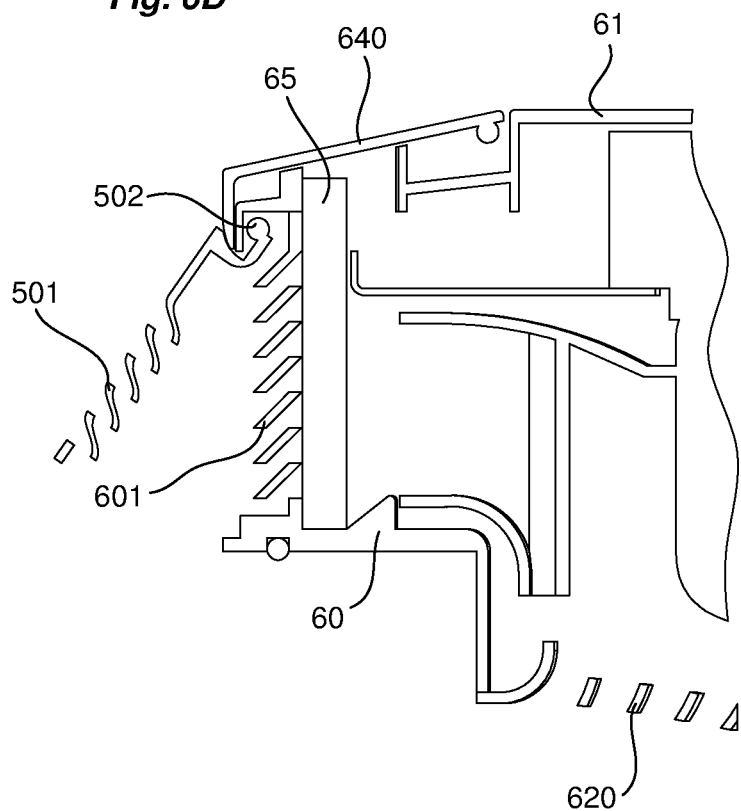

FIG. 6D—IP55: This fourth configuration is identical to the third configuration, with the exception that the external grids 501 are folded down against the internal grids 601.

FIG. 6E—IP55 "external": This fifth configuration is identical to the fourth configuration, the ventilation unit further having its protective hood 67 that comes to cover its casing.

Moreover, it is to be noted that each one of these five configurations also serves to control the flow rate of air. Indeed, the flow rate can be at a maximum in the first configuration. It will be lower in the second configuration since it is hampered by the external grids 501, and even lower in the third configuration owing to the addition of the filter elements.

As previously mentioned, the square shape of the ventilation unit 5 allows it to be easily linked with one or more other identical ventilation units, optimizing the occupied space.

According to one feature of the invention, it is indeed possible to juxtapose, on the upper wall of the enclosure, at least two ventilation units according to the invention. The two units 5.1, 5.2 are linked contiguously, such that a lateral face of one bears against a lateral face of the other.

Figure 7:
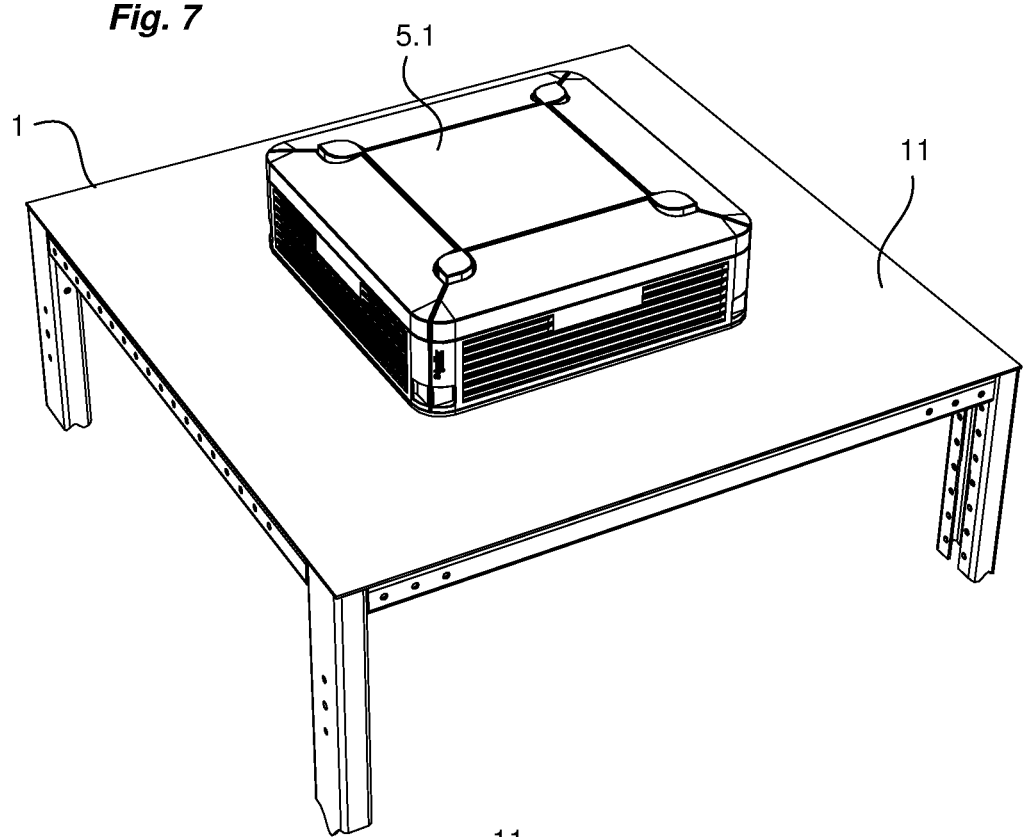
FIGS. 7 to 10 illustrate the principle of juxtaposing multiple ventilation units in accordance with the invention.

FIG. 7 shows, first of all, a solution having a single ventilation unit 5.1. This unit can for example be placed centrally on the upper wall of the electrical enclosure.

Figure 8:
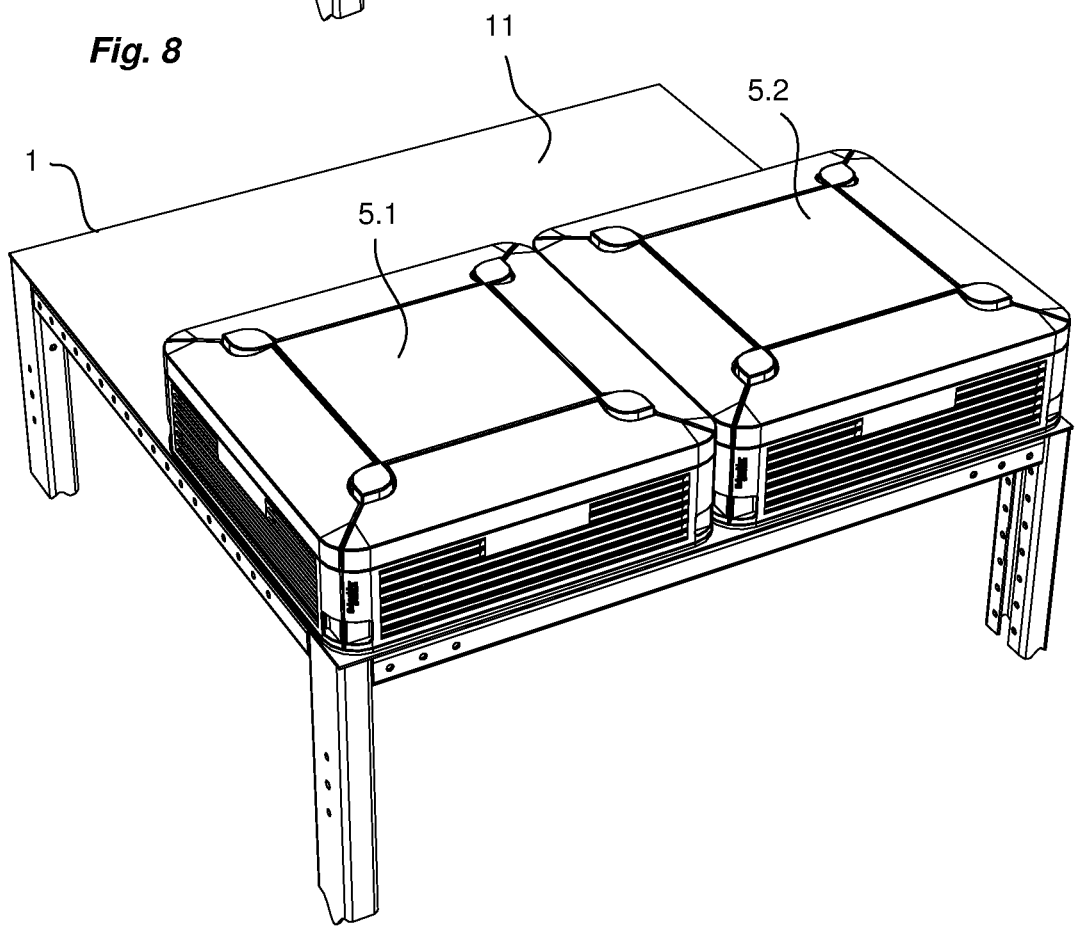
Figure 10:
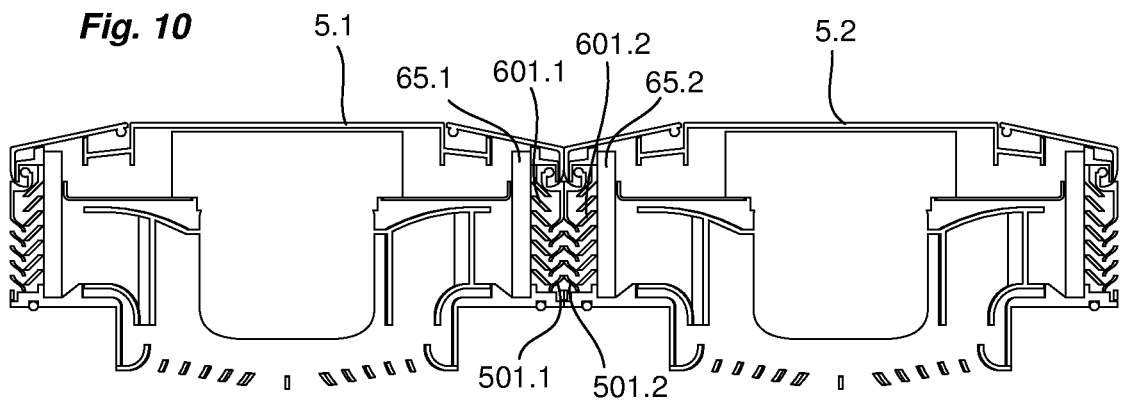

FIG. 8 then shows a solution having two juxtaposed ventilation units 5.1, 5.2, placed on the upper wall 11 of the electrical enclosure 1. In this solution, as shown in FIG. 10, to establish a contiguous juxtaposition, the external grids 501.1, 501.2 that are face to face with one another are necessarily folded down against their respective internal grid 601.1, 601.2. It can be noted that the external grids of the non-contiguous faces could, for their part, be raised depending on the chosen IP configuration. In this configuration, the perfect contiguity of the two ventilation units 5.1, 5.2 serves to prevent any back-flow of air in this region and thus any loss of efficiency of the two-unit system. In FIG. 10, the filter elements 65.1, 65.2 are present but are still optional.

Figure 9:
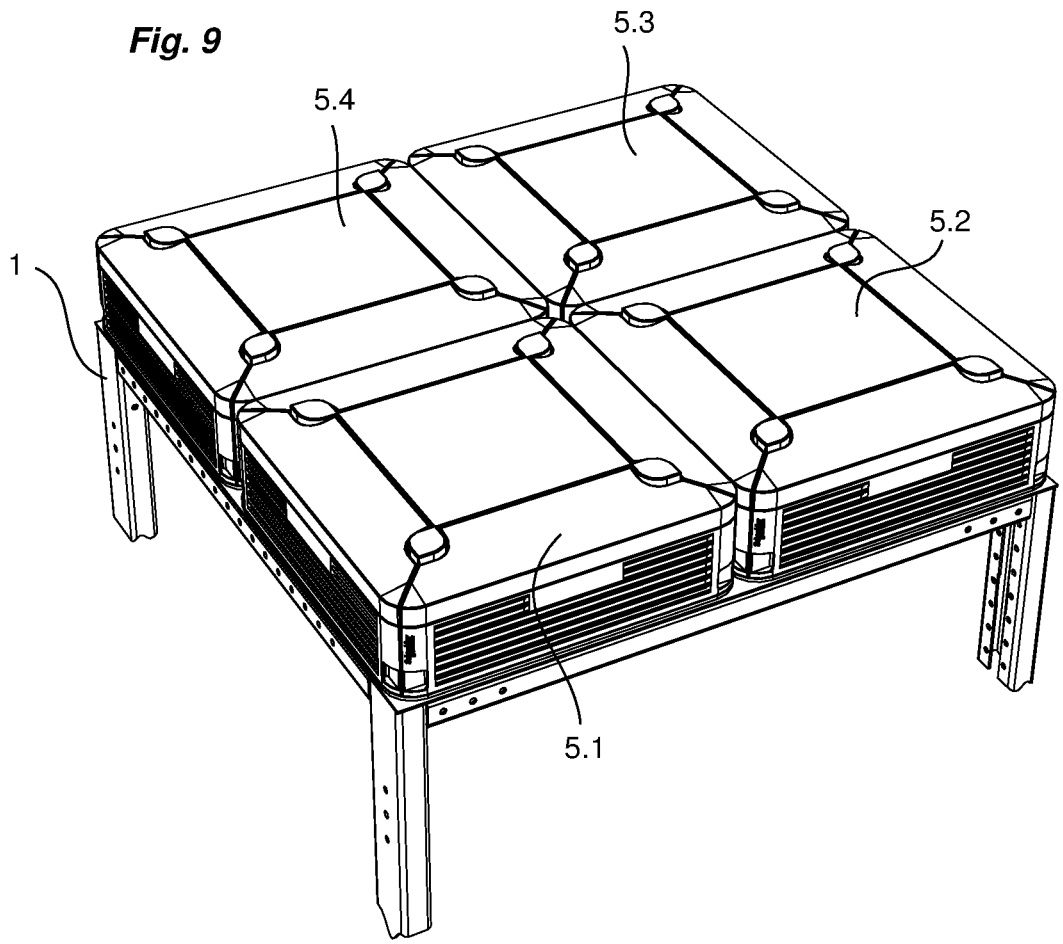

FIG. 9 shows a solution having four juxtaposed ventilation units 5.1, 5.2, 5.3, 5.4, placed on the upper wall of the electrical enclosure. The four units thus form a large square. Thus, in this solution, each ventilation unit has two of its lateral faces which are contiguous with a lateral face of an adjacent ventilation unit. As before, the joins are made so as to avoid any back-flow of air and thus does not cause any loss of efficiency. The external grids of the non-contiguous faces can be raised in order to correspond to a particular protection rating.

If installed outside ("outdoor" version), it is also possible to provide a hood of suitable form, which covers two, three or four juxtaposed ventilation units.

The possibility of arranging multiple ventilation units 5.1, 5.2, 5.3, 5.4 according to the invention on a same upper wall 11 of an electrical enclosure 1 serves to easily adjust the flow of air required for cooling the electrical equipment 13 present in the electrical enclosure 1. It is in particular possible to increase or reduce the number of ventilation units installed on the enclosure, as required.

Figure 11:
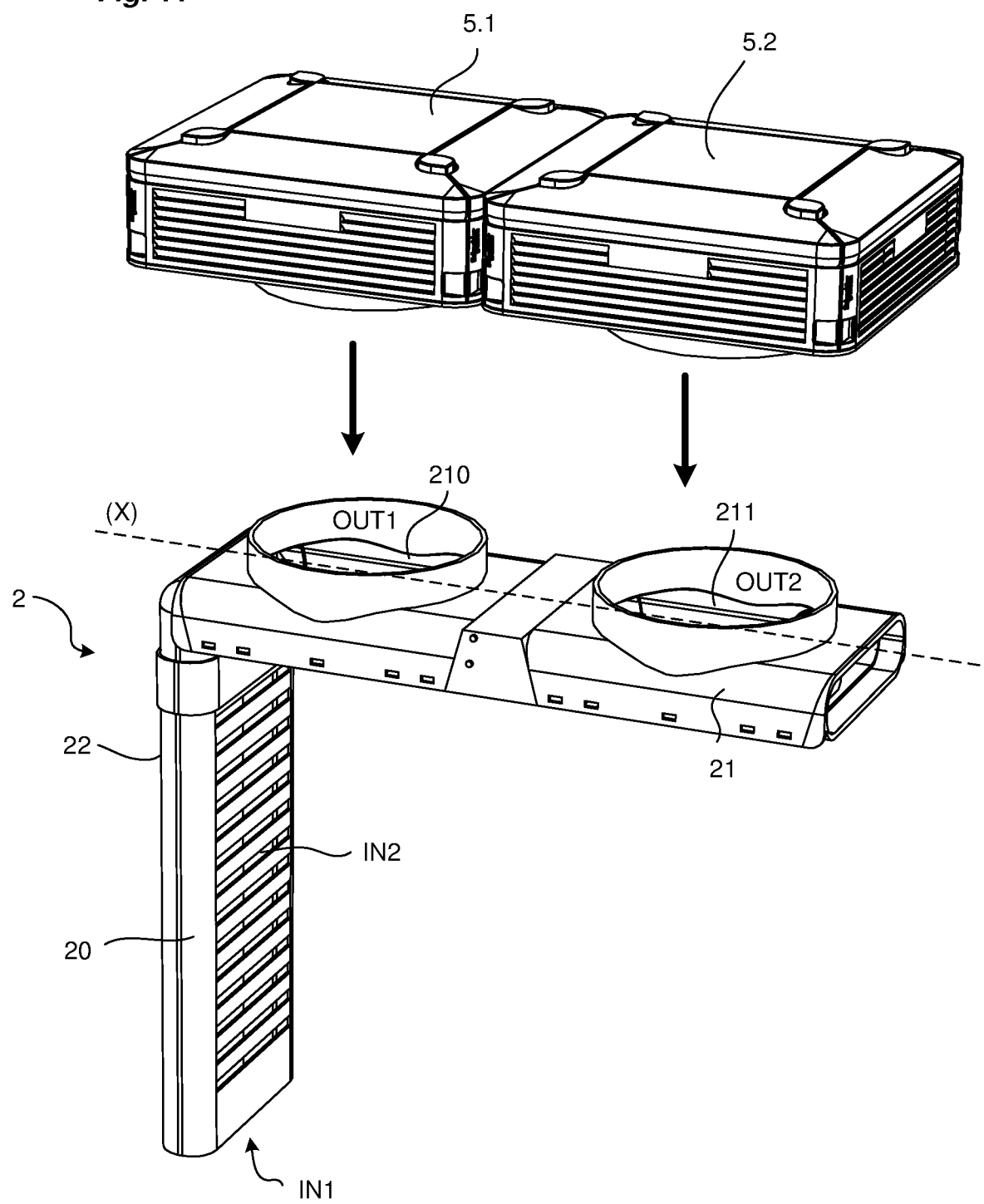
FIG. 11 shows an air flow management system used in association with two ventilation units in accordance with the invention.

According to one particular aspect of the invention, shown in FIG. 11, it is equally possible to provide two ventilation units 5.1, 5.2 according to the invention, used redundantly by adding a suitable air flow management system 2 in the overall electrical installation. This air flow management system 2 may comprise a casing 22 in the form of two ducts 20, 21 that are connected to one another at right angles and positioned advantageously inside the volume of the electrical enclosure 1. The first duct 20 may comprise multiple air inlets IN1, IN2 which serve as an entry point for the flow of air generated in the electrical enclosure. The second duct 21 extends along an axis (X) and comprises, for its part, two openings 210, 211 each forming a distinct air outlet OUT1, OUT2 that is in communication with a distinct ventilation unit. This system further comprises an air flow switching device 3 consisting for example of two pivotably mobile shutters 30, 31. The two mobile shutters 30, 31 are able to adopt a first, "closed" position in which they close off the connection between each air inlet IN1, IN2 and the second air outlet OUT2, and a second, "open" position in which they permit the connection between each air inlet IN1, IN2 and the second air outlet OUT2. Advantageously, the two mobile shutters 30, 31 can be controlled and able to pivot solely under the pressure of the flow of air flowing in the second duct of the system.

It can also be noted that the system is located in the volume V1 of the electrical enclosure while the two ventilation units 5.1, 5.2 are outside the electrical enclosure.

With reference to FIGS. 12A and 12B, the principle of redundant operation of the two ventilation units 5.1, 5.2 is as follows:

In a first operating state of the system (FIG. 12A) the fan VENT1 of the first ventilation unit 5.1 is running and the fan VENT2 of the second ventilation unit 5.2 is stopped. The flow of air F1 drawn from inside the electrical enclosure 1 enters the system via each air inlet IN1, IN2, passes into the first duct 20 and thence the second duct 21. Since the fan VENT1 is running, the flow of air F1 is drawn towards the first air outlet OUT1 of the system 2 and escapes to the outside via the first air outlet OUT1 and the fan VENT1. Since the fan VENT2 is stopped, no flow of air pushes against the mobile shutters 30, 31, and so these remain in their closed position.

In a second operating state of this system (FIG. 12B), the fan VENT1 of the first ventilation unit 5.1 is stopped (it is for example broken down or undergoing maintenance, or the like). The fan VENT2 of the second ventilation unit 5.2 is activated. The flow of air F2 drawn from inside the volume V1 of the electrical enclosure 1 enters the system 2 via each air inlet IN1, IN2, passes into the first duct 20 and thence the second duct 21. Since the fan VENT1 is stopped and the fan VENT2 is running, the flow of air F2 is directed towards the second air outlet OUT2. The flow of air F2 presses on the mobile shutters 30, 31 and pushes against them so as to make them pivot. Thus, the flow of air F2 passes through the opening that is created by the pivoting of the shutters, and reaches the second air outlet OUT2 whence it is expelled to the outside by means of the fan VENT2.

It is to be noted that the detection of the stoppage of the fan VENT1 and the activation of the fan VENT2 can be done by any means, automatic and/or manual.

The solution of the invention therefore presents numerous advantages, among which:
- a reliable solution for a ventilation unit 5 with which it is possible to propose, on the basis of a given architecture, multiple different protection ratings;
- a ventilation unit 5 that is easy to install and to link with one or more other identical ventilation units, making it possible to offer a high degree of modularity and a solution that can be adapted to requirements;
- a ventilation unit 5 having a simple architecture while being particularly effective.

The invention claimed is:

1. Ventilation unit for an electrical cabinet, comprising a fan, a casing that comprises a plinth and a cover assembled on the plinth, wherein:
   the casing has a straight slab form having a square base, four lateral faces and an upper face;
   said plinth comprises a lower wall forming said base of the casing and a lateral wall following the four lateral faces of the casing, an opening made through the lower wall thereof and a seat made around the opening thereof and receiving the fan; and the cover is affixed to the plinth and comprises the upper face of the casing, and wherein following each lateral face, the lateral wall of the plinth comprises a first grid and the ventilation unit comprises a second grid mounted pivotably and covering said first grid.

2. Ventilation unit according to claim 1, further comprising multiple cavities, each arranged in front of each first grid of the plinth, and a distinct filter element positioned in each cavity, in front of each first grid of the plinth.

3. Ventilation unit according to claim 2, wherein the cover comprises multiple pivoting flaps, each providing access to a distinct cavity receiving the filter element.

4. Ventilation unit according to claim 1, wherein each second grid is attached to the cover and is mounted pivotably on said cover.

5. Ventilation unit according to claim 1, further comprising a protective hood forming a hat intended to cover said casing.

6. Ventilation unit according to claim 5, wherein the protective hood comprises a main wall affixed to the cover and multiple inclined lateral flanks extending in front of the lateral faces of said casing.

7. Electrical installation comprising an electrical cabinet having a lower wall, an upper wall and lateral walls, and further comprising a modular ventilation system comprising multiple independent, identical ventilation units, each ventilation unit being as defined in claim 1 and positioned on the upper wall of the electrical cabinet.

8. Electrical installation according to claim 7, wherein the ventilation units are positioned on the upper wall of the electrical cabinet, and at least one lateral face of one ventilation unit is in contact with at least one lateral face of another ventilation unit.

9. Electrical installation according to claim 7, further comprising an adaptable air flow management system on the electrical cabinet, said air flow management system comprising:
- a casing comprising at least one air inlet intended to be brought into communication with the internal volume of the electrical cabinet, at least two air outlets and at least one main duct arranged to connect said air inlet to the two air outlets,
- a switching device arranged inside said main duct, between the first air outlet and the second air outlet, said switching device comprising mobile shutters that can be switched between a first position in which the air inlet communicates solely with the first air outlet and a second position in which the air inlet communicates at least with the second air outlet.

* * * * *